United States Patent [19]

Himics et al.

[11] 4,054,454
[45] Oct. 18, 1977

[54] PHOTOSENSITIVE COPOLYMER ON SILICON SUPPORT

[75] Inventors: Richard Joseph Himics, Skillman; Scott Oliver Graham; Daniel Louis Ross, both of Princeton, all of N.J.

[73] Assignee: RCA Corporation, New York, N.Y.

[21] Appl. No.: 659,976

[22] Filed: Feb. 20, 1976

Related U.S. Application Data

[62] Division of Ser. No. 555,728, March 6, 1975, Pat. No. 3,964,909.

[51] Int. Cl.² .......................... G03C 1/68; G03C 5/00
[52] U.S. Cl. .......................................... 96/67; 96/35.1; 96/36.2; 96/86 P; 96/115 R; 204/159.14; 260/63 R; 260/63 UY

[58] Field of Search .................. 96/115 R, 35.1, 36.2, 96/67, 86 P; 204/159.14, ; 260/63 UY, 63 R

[56] References Cited

U.S. PATENT DOCUMENTS

| | | | |
|---|---|---|---|
| 3,884,696 | 5/1975 | Bowden et al. | 96/115 R |
| 3,935,331 | 1/1976 | Poliniak et al. | 96/115 R |

*Primary Examiner*—Jack P. Brammer
*Attorney, Agent, or Firm*—H. Christoffersen; Birgit E. Morris; Joseph T. Harcarik

[57] ABSTRACT

Copolymers of certain keto-olefins and $SO_2$ are sensitive to light and form films useful as photoresists in the manufacture of printed circuits, integrated circuits, printing plates and the like.

6 Claims, 1 Drawing Figure

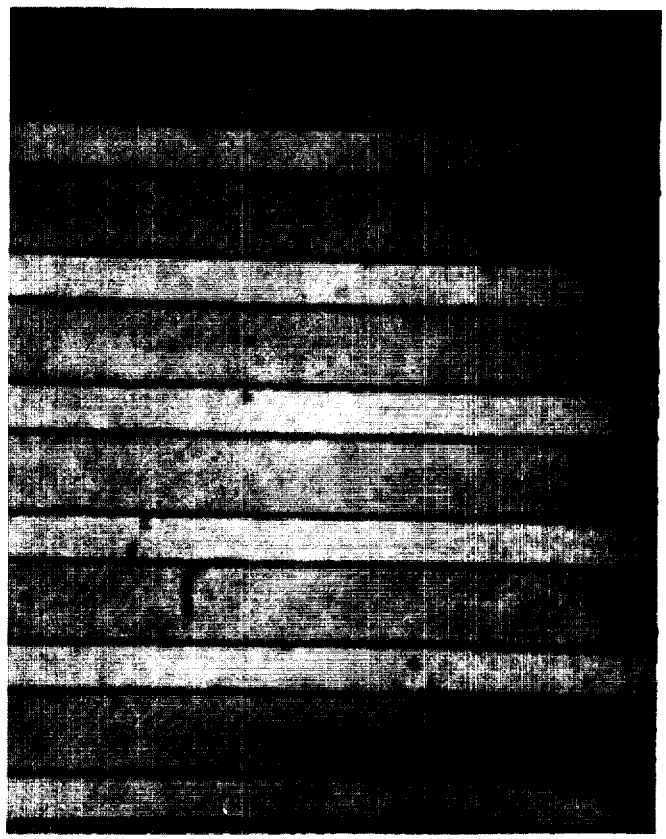

PHOTOSENSITIVE COPOLYMER ON SILICON SUPPORT

This is a division of application Ser. No. 555,728, filed Mar. 6, 1975, now U.S. Pat. No. 3,964,909.

This invention relates to a novel photoresist composition. More particularly, this invention relates to photoresists comprising copolymers of $SO_2$ and certain ketoolefin compounds.

BACKGROUND OF THE INVENTION

In the manufacture of various semiconductor devices wherein an oxide coating is formed on a semiconductor substrate, it is often required to remove selected portions of the oxide coating. This is done conventionally by applying a photoresist film to the oxide coating, exposing the photoresist to light through a photomask which is patterned in the desired configuration, developing the exposed photoresist with a solvent to form a relief pattern and etching to remove the oxide layer not still protected by the photoresist. Positive photoresists become more soluble in the regions exposed to the light and negative photoresists become less soluble in the regions exposed to the light. After etching, the remaining photoresist is stripped from the oxide layer.

As integrated circuits and other semiconductor devices become smaller, the requirements for the photoresist become more stringent. Good photoresists should have good adherence to the oxide substrate; should have a high contrast to light so that very fine patterns can be developed; should have a relatively high solubility difference between the exposed and nonexposed areas; should be resistant to the etching solution employed so that they do not lift off or curl at the edges during etching; should be non-tacky so that they do not adhere or distort on contact with a photomask; and finally, should be able to be removed from the oxide layer rapidly and cleanly. Thus, there is a continuing search for new photoresists with improved sensitivity and effectiveness.

A major problem with existing photoresists is poor adherence to the substrate. This results in undercutting of the photoresist during the etching step and leads to reduced edge definition of the pattern obtained. Prior art workers have attempted to improve known photoresists by prebaking or postbaking to improve the adhesion of the photoresist to the oxide substrate, but these steps add to processing time and expense and are not wholly effective. Other workers have added reagents to improve this adhesion, but these reagents reduce photoresist sensitivity and some reagents cause difficulties in removal of the resist layer after etching.

SUMMARY OF THE INVENTION

We have found that films of copolymers of $SO_2$ and certain keto-olefins are excellent positive photoresists having useful sensitivity, adhesion and etch resistance characteristics. The photoresists form non-tacky films from solution that do not require either prebaking or postbaking steps, with concomitant savings in processing.

BRIEF DESCRIPTION OF THE DRAWING

The FIGURE is a photomicrograph of a pattern in a silicon oxide coated silicon wafer obtained using a photoresist of the invention.

DETAILED DESCRIPTION OF THE INVENTION

The copolymers of the invention comprise a copolymer of $SO_2$ and a keto-olefin of the formula:

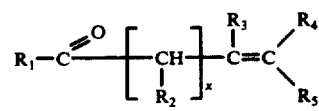

wherein $R_1$ is alkyl, aryl or substituted aryl; $R_2$ is hydrogen or methyl; $x$ is an integer of 1 or 2; $R_3$ is hydrogen or is part of a carbocyclic ring with $R_4$ or $R_5$ with the proviso that when $x$ is 2, $R_3$ must be hydrogen; $R_4$ is hydrogen, alkyl or aryl, and $R_5$ is hydrogen or, when $R_4$ is hydrogen, is alkyl or aryl, or $R_4$ and $R_5$ together are part of a carbocyclic ring.

The copolymers useful herein can be prepared by reacting a keto-olefin as described hereinabove with liquified $SO_2$ at low temperatures. A free radical initiator can be added to improve the rate of polymerization. Polymerization is effected in a sealed polymerization tube at temperatures of about $-10°$ to about $-80°$ C. for a period of several hours. In preparing the copolymer, an excess of $SO_2$ can be present. A useful molecular weight range for the copolymers is from about 50,000 to about 1,500,000, preferably from about 100,000 to about 800,000.

The polymers can be purified by conventional techniques, as by precipitating from a solvent, such as DMF, or 1,1,2,2-tetrachloroethane, with a miscible non-solvent, which can include water, methyl ethyl ketone, toluene, chlorobenzene, methyl cellosolve acetate or the like.

The copolymer is dissolved in a suitable solvent and solution cast or spun onto a desired support for use as a photoresist. The concentration of the copolymer in the solvent is adjusted so as to deposit a film of the desired thickness. The solvent is then removed in conventional manner as by drying, evaporating and the like.

A sensitizer can also be added to the copolymer. Photosensitizers are well known and include for example, aromatic nitro compounds such as 2-nitrofluorene, picramide, trinitroaniline, nitronaphthalene, 5-nitroacenaphthalene and the like; ketones such as benzophenone, Michler's ketone and the like; quinones such as naphthaquinone, anthraquinone, 2,3-diphenylanthraquinone and the like; and anthrones such as benzanthone; and pyrylium salts. From about 0.1 to about 40% by weight of the sensitizer based on the weight of the copolymer is suitable.

The photoresist film is then selectively exposed to light having a wavelength in the range of about 3000 to 4500 Angstroms. The film is developed by immersing in a developer solvent, generally for from about 5 to about 15 minutes. Suitable developer solvents include 1,2-dichloroethane and methyl cellosolve acetate. Mixtures of solvents and miscible nonsolvents can also be employed as developer solvents.

The above-described positive photoresists are useful in the manufacture of printed circuits, integrated circuits, printing plates for relief printing, photoprinting plates and the like. In the manufacture of devices whereby a pattern is fabricated on a silicon oxide coated silicon wafer by applying a photoresist to the silicon oxide layer, exposing the photoresist to a light pattern, developing the exposed photoresist to remove the exposed portions thereof, thereby uncovering portions of the oxide layer, etching to remove the uncovered portions of the oxide layer and removing the remaining photoresist, the above-described photoresists give excellent results. The present photoresists form non-tacky films that adhere well to silicon oxide, have useful sensitivity, can be developed to form highly resolved patterns, are inert to conventional etchants and are readily removable after etching.

The invention will be further described in the following examples but it is to be understood that the invention is not meant to be limited to the details described therein.

EXAMPLE 1

Part A-Preparation of Copolymer

One-tenth mol (9.81 grams) of 5-hexene-2-one was charged to a polymerization tube containing 15 milliliters of liquified $SO_2$. The tube was sealed and maintained at $-78°$ C. for 16 hours.

The resultant polymer softened at 100° C. Elemental analysis was as follows:

Calculated for $C_6H_{10}SO_3$: C, 44.44; H, 6.17; S, 19.75; Found: C, 44.37; H, 6.51; S, 19.36.

The white polymer was dissolved in DMF, and poured into ice water. It was soluble in 1,1,2,2,-tetrachloroethane and cyclopentanone and partly soluble in dioxane and 1,2-dichloroethane.

Part B-Preparation and Exposure of Photoresist

One solution of the copolymer prepared as above was made by dissolving 0.7 gram of the copolymer in 10 milliliters of cyclopentanone.

A second solution was prepared containing 0.35 gram of the copolymer and 0.1 gram of benzophenone sensitizer in 5 milliliters of cyclopentanone.

Films of the resist about 1 micron thick were spun onto glass slides coated with a chromium-nickel film at 2000 rpm with both solutions. The films were exposed through a typical metal television aperture mask using a mercury-xenon lamp having a wavelength range of about 2600°–4800A. The films were developed by immersing the exposed slides in a 2½% by volume toluene/1,2-dichloroethane mixture for 10 minutes.

The resist prepared from the copolymer alone gave a pattern which was not completely defined down to the substrate. The resist prepared from the sensitized copolymer gave a well-formed 12–13 mil (0.030–0.033 cm) hole pattern.

EXAMPLE 2

A solution of the copolymer and sensitizer as in Example 1 was filtered through a 0.8 micron filter and spun onto oxidized silicon wafers grown at 900° C. in the presence of hydrochloric acid according to the method described in U.S. Pat. No. 3,556,879 to Mayer.

The film was spun at 3000 rpm for 30 seconds. The wafer was exposed through a glass photomask having a chromium pattern of 10 micron bars separated by 5 micron gaps using a mercury arc lamp in an integrated circuit mask aligner. The film was developed by immersing in a 2½% by volume toluene/1,2-dichloroethane mixture for 10 minutes and the wafer etched by immersing in buffered HF at room temperature. After about 3 minutes, the wafers were rinsed with water, spun dry in air and the resist removed in Caro's acid.

The film was an excellent etch photoresist, with good adherence to the substrate and good etch resistance. Excellent pattern definition was achieved, as can be seen from the FIGURE which is a photomicrograph (1200 X) of the etched pattern.

We claim:

1. A recording medium comprising a film containing a sufficient amount of a photosensitive copolymer to form a photoresist wherein the photosensitive copolymer is a copolymer of $SO_2$ and a keto-olefin of the formula:

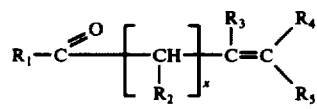

wherein $R_1$ is alkyl, aryl or substituted aryl; $R_2$ is hydrogen or methyl; $x$ is an integer of 1 or 2; $R_3$ is hydrogen or is part of a carbocyclic ring with $R_4$ or $R_5$, with the proviso that when $x$ is 2, $R_3$ is hydrogen; $R_4$ is hydrogen, alkyl or aryl, $R_5$ is hydrogen or when $R_4$ is hydrogen, is alkyl or aryl, or $R_4$ and $R_5$ together are part of a carbocyclic ring, on a support.

2. A recording medium according to claim 1 wherein the photosensitive copolymer has recurring units of the formula:

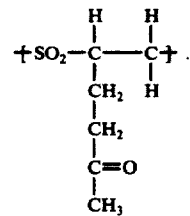

3. A recording medium according to claim 1 wherein said film additionally contains a sensitizer.

4. A recording medium according to claim 2 wherein said film additionally contains a sensitizer.

5. A recording medium according to claim 4 wherein the sensitizer is benzophenone.

6. A recording medium according to claim 1 wherein the support is silicon oxide-coated silicon.

* * * * *